United States Patent
Yokoshima (10) Patent No.: US 6,417,080 B1
(45) Date of Patent: *Jul. 9, 2002

(54) METHOD OF PROCESSING RESIDUE OF ION IMPLANTED PHOTORESIST, AND METHOD OF PRODUCING SEMICONDUCTOR DEVICE

(75) Inventor: Shigenobu Yokoshima, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/491,876

(22) Filed: Jan. 27, 2000

(30) Foreign Application Priority Data

Jan. 28, 1999 (JP) .............................. 11-019918

(51) Int. Cl.$^7$ .......................................... H01L 21/3065
(52) U.S. Cl. .................... 438/514; 438/715; 438/725; 438/726
(58) Field of Search ................ 438/710, 715, 438/725, 726, 514

(56) References Cited

U.S. PATENT DOCUMENTS

| | | | |
|---|---|---|---|
| 5,034,086 A | 7/1991 | Sato | ............................ 156/345 |
| 5,226,056 A | * 7/1993 | Kikuchi et al. | |
| 5,393,374 A | * 2/1995 | Sato et al. | |
| 5,567,271 A | * 10/1996 | Chu et al. | |
| 5,792,314 A | * 8/1998 | Shima et al. | |
| 5,902,134 A | * 5/1999 | Egashira | |
| 6,024,887 A | * 2/2000 | Kuo et al. | |
| 6,043,004 A | * 3/2000 | Kurimoto | |

FOREIGN PATENT DOCUMENTS

| | | |
|---|---|---|
| EP | 0880164 A1 | 11/1998 |
| JP | 5-160022 | 6/1993 |
| JP | 5-275326 | 10/1993 |
| JP | 6-104223 | 4/1994 |
| JP | 6-91049 | 11/1994 |
| JP | 2785027 | 5/1998 |

* cited by examiner

*Primary Examiner*—Keith Christianson
*Assistant Examiner*—Stephen W. Smoot
(74) *Attorney, Agent, or Firm*—Fitzpatrick, Cella, Harper & Scinto (57) ABSTRACT

In order to carry out ashing at a high efficiency without leaving any residue and also to inhibit corrosion of an underlying material of a resist and further to prevent particle contamination, a photoresist is ashed at a low temperature to be removed and a residue of the photoresist is removed at a high temperature.

48 Claims, 3 Drawing Sheets

METHOD OF PROCESSING RESIDUE OF ION IMPLANTED PHOTORESIST, AND METHOD OF PRODUCING SEMICONDUCTOR DEVICE

BACKGROUND OF THE INVENTION

1. Field of the Invention

This invention relates to a method of producing a semiconductor device or the like as well as a processing method of removing a photoresist on a substrate used for the method, a residue thereof, or the like and particularly, relates to a processing method of removing a residue which results from ion implantation of a dopant or the like and is difficult to ash (hereinafter simply referred to as "nonashable residue").

2. Related Background Art

In the production process for a semiconductor device, a photoresist as a photosensitive resin is widely used as a masking material for selective etching and local ion implantation to form a device structure. The corresponding photoresist needs to be removed after various processes utilizing this, and in recent years, is generally removed by oxidization and ashing through dry processing with oxidation action mainly using oxygen plasma, oxygen radicals, ozone, and so on.

As a method of removing a photoresist as an organic substance consisting mainly of carbon and hydrogen, a technique is widely used in which the photoresist is exposed to oxygen as activated by electric discharge or irradiation with ultra violet and is gasified through the oxidation action into steam, carbon dioxide, carbon monoxide, etc., thus effecting ashing and removal.

On the other hand, in the case where a photoresist is used as a mask for ion implantation of a dopant, etc., the resist, the surface of which is modified by the energy of implanted ions, will be difficult to remove by oxidation, so that the processing efficiency decreases significantly. In addition, it is known that, when an ion implanted photoresist is heated to 150° C. to 250° C. as the normal ashing temperature, the phenomena (popping) that the surface modified layer bursts by steam of an organic solvent generated from an unmodified layer in a lower portion of the photoresist to form flake-shaped particles to be scattered around, is observed, so that the wafer is contaminated. Moreover, since dopant ions such as As, P, B, etc. do not form any substance of a high vapor pressure by oxidation, oxides of the ions will remain on the wafer after the resist has been ashed and removed by oxygen-based active species and needs to be removed by subsequent wet processing.

For the purpose of removing the above mentioned resist which is generated after ion implantation and is difficult to ash, there have hitherto been proposed a method in which after a modified layer of the resist surface is removed while hydrogenating and removing the dopant ions with a hydrogen plasma or steam plasma, an underlying unmodified layer is ashed and removed with an oxygen plasma, a method in which the resist is ashed and remove with a plasma of a mixed gas obtained by adding to oxygen gas a gas containing fluorine having a function to increase the ashing rate and to remove the implanted ion species, or the like.

In addition, Japanese Patent Application Laid-Open No. 5-275326 discloses a method in which after processing using oxygen and $CF_4$, a further processing is effected using oxygen and nitrogen, and Japanese Patent Application Laid-Open No. 6-104223 discloses a method in which after processing using oxygen and nitrogen, a further processing is effected using oxygen and $SF_6$. Moreover, Japanese Patent Application Laid-Open No. 5-160022 discloses a method in which a photoresist is ashed with an oxygen plasma, and a residue is then ashed with a hydrogen plasma.

However, in the case where a modified layer generated by ion implantation is removed with a hydrogen plasma or steam plasma, the processing efficiency generally becomes small due to its low reaction rate. Moreover, it is necessary to sufficiently raise the temperature of an article to be processed (hereinafter referred to as "processing article") in order to increase the reaction rate, so that the popping phenomenon is apt to take place more easily.

In a processing with a plasma of a mixed gas formed by adding to oxygen a gas containing fluorine as a halogen which is an example of the gas containing halogen, the processing efficiency is improved by the function of generated fluorine ions and fluorine radicals, compared with the case of using an oxygen plasma only. However, since low temperature processing is apt to give rise to a photoresist residue, in order to avoid this, it is necessary to effect processing at a high temperature which is apt to cause the popping.

In view of the problems as described above, in the actual producing process, after ashing with oxygen has been effected, oxides of a dopant remaining on a wafer as a processing article are cleaned and removed in a subsequent wet processing.

SUMMARY OF THE INVENTION

An object of the present invention is to provide a processing method that can remove a foreign matter on a surface of a processing article at a high efficiency without leaving any residue such as an oxide of an ion implanted dopant.

According to a first aspect of the present invention, there is provided a method of removing a residue comprising ashing and removing a dopant-implanted photoresist to expose a surface of a processing article and then removing a dopant-containing residue of the photoresist remaining on the surface of the processing article, wherein the dopant-containing residue is removed at a temperature higher than the temperature at which the photoresist is ashed and removed.

According to a second aspect of the present invention, there is provided a method of processing an article comprising the steps of:

ashing and removing a dopant-implanted photoresist on a surface of an article at a first temperature; and removing a dopant-containing residue of the photoresist at a second temperature higher than the first temperature.

According to a third aspect of the present invention, there is provided a method of producing a semiconductor device comprising the steps of:

forming a photoresist pattern on a surface of a substrate;

implanting a dopant in the substrate using the photoresist pattern as a mask;

ashing and removing a dopant-implanted photoresist on the surface of the substrate at a first temperature; and removing a dopant-containing residue of the photoresist at a second temperature higher than the first temperature.

DETAILED DESCRIPTION OF THE PREFERRED EMBODIMENTS

Figure 1:
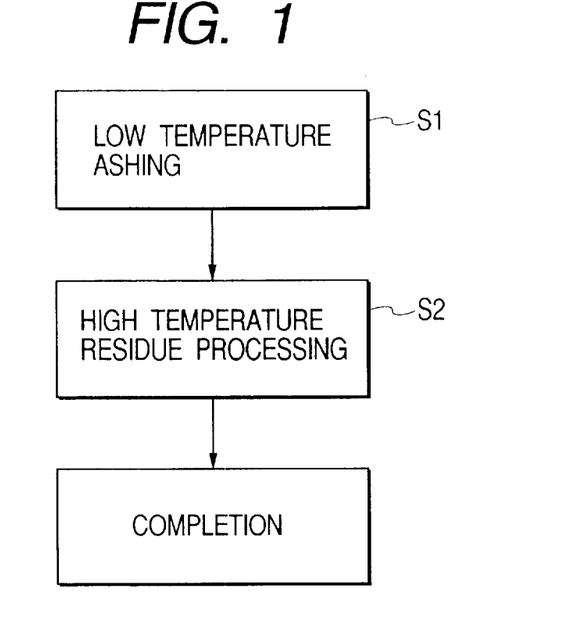
FIG. 1 is a flow chart showing the processing method of the present invention.
Figure 2A:
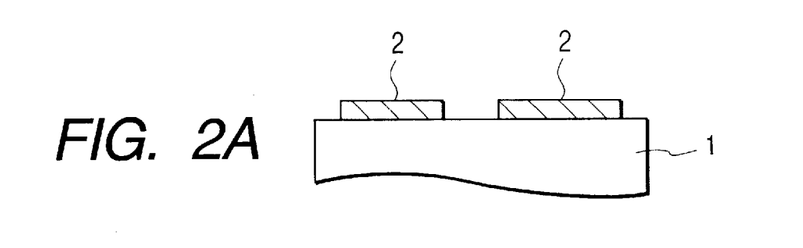
FIGS. 2A, 2B and 2C are schematic sectional views showing the processing according to the present invention.
Figure 2B:
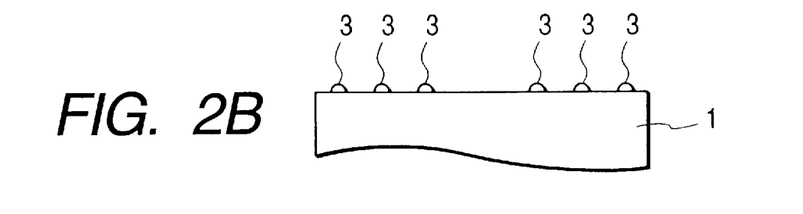
Figure 2C:
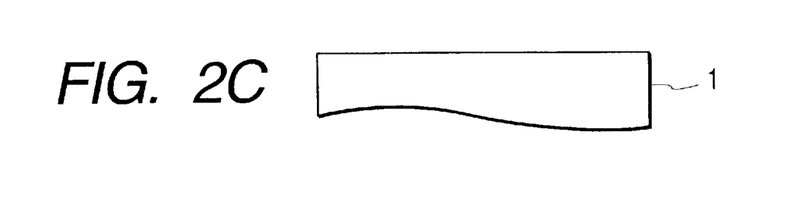

FIG. 1 is a flow chart showing the processing method of the present invention, and FIGS. 2A, 2B and 2C are schematic sectional views showing the processing according to the present invention.

A processing article such as a silicone wafer is denoted as 1, a photoresist in which a dopant such as phosphorus, arsenic, boron, etc. has been ion implanted is denoted as 2, and a residue containing an oxide of the dopant such as phosphorus oxide and arsenic oxide, boron oxide, etc. is denoted as 3.

In a step S1, the dopant-implanted photoresist 2 is ashed and removed so that a surface of the processing article 1 is exposed.

Thereafter, in a step S2, the dopant-containing residue 3 remaining on the surface of the processing article 1 is removed.

At this time, the residue 3 containing the dopant is removed at a temperature T2 higher than the temperature of the step S1, i.e., a temperature T1 when ashing and removing the photoresist.

Thus, a highly clean surface of the processing article is obtained.

Using a low temperature in the step S1 suppresses popping, while using a high temperature in the step S2 improves removal efficiency of the dopant oxide.

The temperature of a processing article in the step S1 is preferably a temperature lower than 150° C., specifically 130° C. or lower, and more preferably 120° C. or lower.

The temperature of a processing article in the step S2 may be any temperature higher than the temperature of the processing article in the step S1, and more preferably 150° C. or higher, and most preferably 200° C. or higher.

In the step S1, an oxidizing gas (a first gas) is used to ash a photoresist. It is preferable to carry out ashing using a plasma of a gas not containing fluorine so as not to damage a surface of the processing article. The term "gas not containing fluorine" as used herein is intended to encompass those gases to which a fluorine-based gas is not added intentionally. Therefore, those gases in which fluorine is detected at the so-called background level or contamination level may be used in the present invention. As the first gas used in the step S1, there may be included oxygen gas with an oxygen concentration of 100%, a mixed gas of oxygen gas and an inert gas (with any oxygen concentration), or the like. As the inert gas, rare gases such as helium, argon, neon, xenon, krypton, etc. and nitrogen gas are used. In addition, water, nitrogen oxide, etc. may be added as the occasion demands.

The gas used in the step S2 includes a gas containing at least one of fluorine and hydrogen, more specifically carbon fluoride, nitrogen fluoride, ammonia, sulfur fluoride, fluorine, hydrogen, and water. If necessary, they may be mixed with oxygen gas or an inert gas when used. Among others, carbon fluoride, nitrogen fluoride, sulfur fluoride, and ammonia are preferable. Oxygen has not only a function of serving as a diluent gas, but also a function of reacting with carbon or nitrogen generated from carbon fluoride, nitrogen fluoride or ammonia to form carbon dioxide gas or nitrogen oxide gas thus removing remaining carbon or remaining nitrogen from a processing space quickly.

In the steps S1 and S2, it is preferable to effect plasma processing by use of a microwave plasma of the above mentioned first or second gas.

As the second gas, among others, $CF_4$, $C_2F_6$, $C_3F_8$, $C_3F_6$, $NF_3$, $SF_6$, $NH_3$, etc. are preferably used. These may be mixed with oxygen when used. Of the photoresist into which phosphorus, arsenic, boron, etc. have been implanted, the organic component is oxidized and removed in the first step, and thereafter, in the second step, oxides remaining on the processing article are mainly removed. The dopant such as phosphorus, arsenic, boron, or the like is converted by the action of active species such as fluorine ions, fluorine radicals, hydrogen ions, hydrogen radicals, etc. into a volatile fluoride or hydride to be removed from the surface of the processing article. A carbon fluoride based gas or nitrogen fluoride based gas does not contain any element to cause undesired contamination and has a good efficiency in generating fluorine active species, which allows desired effects to be exhibited with less addition amount thereof, so that the surface of the processing article will not be damaged seriously. In addition, ammonia is very effective, since it can be handled more easily than hydrogen and can generate hydrogen active species efficiently because of its low N—H binding energy, and since thus generated NH radicals have long lifetime and can therefore reduce the oxides of the dopant efficiently.

Embodiment 1

Figure 3:
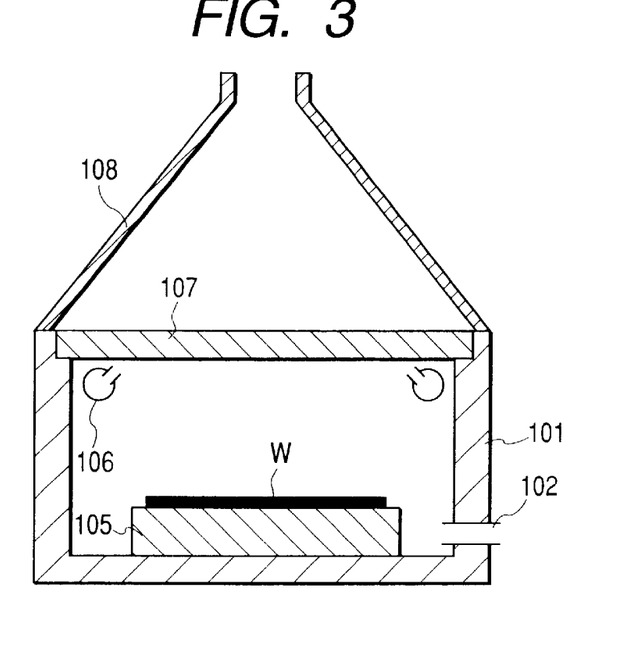
FIG. 3 is a sectional view showing an example of a plasma processing apparatus used in the present invention.

FIG. 3 is a sectional view showing a configuration of a plasma processing apparatus which generates a plasma using microwaves to plasma process a wafer as the processing article. Reference numeral 101 denotes a vacuum container, which together with a dielectric window 107 for microwave introduction forms a processing chamber for plasma generation therein, which is exhausted through an exhaust opening 102 with a vacuum pump (not shown). A microwave wave guide, which is denoted as 108, guides to the vacuum container microwaves generated in a microwave generator (not shown). A gas inlet tube, which is denoted as 106, supplies the processing chamber with a gas for plasma processing at a predetermined flow rate supplied from a gas supplying system (not shown). In the drawing, a wafer having a photoresist into which phosphorus (P) has been ion implanted is denoted as W and mounted on a heater 105.

The wafer as the processing article is disposed in a position above the heater set at a processing temperature in the ashing apparatus shown in FIG. 3 with a wafer lifting pin or the like to lift the wafer in a floating state. Specifically, after the chamber has been sealed and the inside thereof has been exhausted to substantial vacuum with a vacuum pump (not shown) connected to the chamber, the wafer is disposed on the heater by operating the lift pin or the like. This makes it possible to maintain the wafer temperature lower than the heater temperature by the vacuum insulation effect. In the actual determination, the wafer temperature at this time was about 80° C.

For the purpose of removing organic components of the resist, oxygen gas at a predetermined flow rate shown below is introduced into the chamber and the processing is started under the predetermined conditions shown below, and the time taken until the end point of ashing determined by an end point detecting device with a plasma monitor (not shown) is measured. After a period of time about 1.5 to 2 times the measured time has elapsed, the processing is completed. Thereafter, the inside of the chamber is exhausted to a substantial vacuum.

This will completely remove 95% or more of the photoresist on the wafer to such an extent that no photoresist can be observed with naked eyes.

Active species for ashing can be generated highly efficiently not only with the apparatus shown in FIG. 3 but also with a microwave plasma processing apparatus having a slotted conductor plate. When a microwave plasma processing apparatus is used in which a plate-like antenna or radial line slot antenna formed by providing a plurality of slots in a plate-like H-plane of an endless annular waveguide is employed, it is possible to generate the active species more efficiently. Such apparatuses are disclosed in Japanese Patent No. 2925535 and U.S. Pat. No. 5,034,086.

The typical processing conditions for this first step are as follows.

Gas/Flow Rate: $O_2$/1000 sccm
Processing Pressure: 1 Torr (approximately 133 Pa)
Wafer Temperature of 80° C.<Heater Temperature of 250° C.

Next, in order to break the vacuum insulation and to heat the wafer to the heater temperature, oxygen is introduced into the chamber until the inside pressure reaches substantially atmospheric pressure. However, introduction of any other gas instead of oxygen will not give rise to any particular problem.

Next, after the inside of the chamber has been exhausted again, the second step is carried out. Here, for the purpose of removing a residue not removed only by oxygen and remaining on the wafer, a mixture gas of oxygen/$CF_4$ mixed at a predetermined ratio is introduced at a predetermined flow rate into the chamber, and the processing is started under the predetermined conditions and is continued for about 15 seconds. This processing removes the residue comprised of oxides of the dopant as left after the first step processing.

The processing conditions for this second step are, for example, as follows.

Gas/Flow Rate: $O_2$+$CF_4$/500 sccm+2 sccm
Processing Pressure: 0.6 Torr (approximately 80 Pa)
Wafer Temperature: 250° C.
Microwave Output: 1500 W
Processing Time: approximately 15 seconds.

Embodiment 2

After a wafer as the processing article is disposed on the heater set at a processing temperature (a low temperature) in the ashing apparatus as shown in FIG. 3 to allow the wafer temperature to reach the processing temperature, the chamber is sealed and the inside of the chamber is exhausted to substantial vacuum with a vacuum pump (not shown) connected to the chamber.

For the purpose of removing organic components of the resist, oxygen gas at a predetermined flow rate shown below is introduced into the chamber and the processing is started under the predetermined conditions shown below, and the processing is continued for a period of time which is about twice the time taken until the end point of ashing determined by an end point detecting device with a plasma monitor (not shown).

The processing conditions for the first step are as follows.

Gas/Flow Rate: $O_2$/100 sccm
Processing Pressure: 0.1 Torr (approximately 13.3 Pa)
Wafer Temperature: 80° C.
Microwave Output: 1500 W
Processing Time: approximately 1.5 to 2 times the time period until the emission spectrum or the emission intensity changes.

Afterwards, the chamber is opened to atmosphere and the wafer is taken out. The photoresist on the wafer is removed by 95% or more thereof to such clearness that it can no longer be observed with naked eyes.

After the wafer as the processing article is disposed on the heater set at a processing temperature (a high temperature) in the ashing apparatus as shown in FIG. 3 to allow the wafer temperature to reach the processing temperature, the chamber is sealed and the inside of the chamber is exhausted to substantial vacuum with a vacuum pump (not shown) connected to the chamber. At this time, the processing may either be carried out in another chamber or be carried out in the same chamber with the set temperature changed.

For the purpose of removing a residue left after the removal of the organic components in the resist in the first step processing, a mixture gas of oxygen/$CF_4$ mixed at a predetermined ratio is introduced at a predetermined flow rate into the chamber, and the processing is started under the predetermined conditions and is continued for about 15 seconds. This processing removes the residue comprised of oxides of the dopant to provide a clean surface free from the residue.

The processing conditions for the second step are as follows.

Gas/Flow Rate: $O_2$+$CF_4$/500 sccm+2 sccm
Processing Pressure: 0.6 Torr (approximately 80 Pa)
Wafer Temperature: 250° C.
Microwave Output: 1500 W
Processing Time: approximately 15 seconds.

In this method, since the processing temperature in the first step carried out with a non-fluoride oxidizing gas is set at a temperature lower than the temperature in the second step, namely a temperature sufficiently lower than 150° C., popping was suppressed.

Embodiment 3

Figure 4:
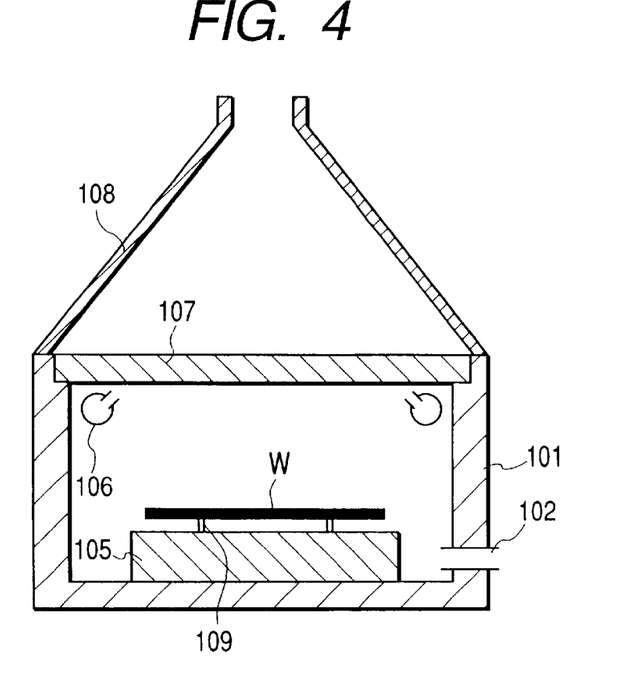
FIG. 4 is a sectional view showing another example of a plasma processing apparatus used in the present invention.

The plasma processing apparatus shown in FIG. 4 is the same as the apparatus of FIG. 3 except that a lift pin 109 is added as a wafer lifting apparatus.

The wafer as the processing article is disposed in a position above the heater in the ashing apparatus shown in FIG. 4 with the lifting apparatus in a floating state, the chamber is sealed and the inside of the chamber is exhausted to substantial vacuum with a vacuum pump (not shown) connected to the chamber.

For the purpose of removing organic components of the resist, oxygen gas at a predetermined flow rate shown below is introduced into the chamber and the processing is started under the predetermined conditions shown below, and the processing is continued for a period of time which is about twice the time taken until the end point of ashing determined by an end point detecting device with a plasma monitor (not shown).

The processing conditions for the first step are as follows.

Gas/Flow Rate: $O_2$/100 sccm
Processing Pressure: 0.1 Torr (approximately 13.3 Pa)

Heater Temperature: 250° C.

Microwave Output: 1500 W

Processing Time: approximately 1.5 to 2 times the time period until the emission spectrum or the emission intensity changes.

The heater temperature at this time is 250° C. However, since the wafer itself is floating above the heater with the lift pin, the temperature of the wafer will be sufficiently lower than 150° C. Thereby, 95% or more of the photoresist can securely be removed.

After the first step, the wafer is lowered to be disposed on the heater with the lift apparatus, and a gas such as oxygen, etc. is introduced into the chamber up to approximate atmospheric pressure to heat the wafer to approximately reach 250° C.

For the purpose of removing a residue left after the removal of the organic components in the resist in the preceding step processing, a mixture gas of oxygen/$CF_4$ mixed at a predetermined ratio is introduced at a predetermined flow rate into the chamber, and the processing is started under the predetermined conditions and is continued for about 15 seconds. This makes it possible to carry out the same processing as that of Embodiment 2 efficiently in a shorter time period.

The processing conditions for the second step are as follows.

Gas/Flow Rate: $O_2$+$CF_4$/500 sccm+2 sccm

Processing Pressure: 0.6 Torr (approximately 80 Pa)

Heater Temperature (Processing Article Temperature): 250° C.

Microwave Output: 1500 W

Processing Time: approximately 15 seconds.

Fluorine active species generated when a gas containing fluorine is subjected to plasma formation will corrode silicon constituting the processing article and silicon oxides if the processing takes a long time. Moreover, if ashing is carried out with addition of a gas containing fluorine, the resist may be fluorinated to be difficult to ash. The Embodiments described above do not give rise to such problems.

Embodiment 4

Next, the producing method of a semiconductor device according to the present invention will be described.

Figure 5A:
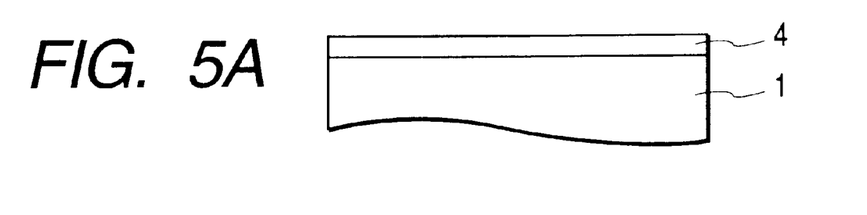
FIGS. 5A, 5B, 5C, 5D and 5E are schematic views showing the method of producing a semiconductor device according to the present invention.

A semiconductor substrate such as an Si wafer is prepared as the processing article 1.

As shown in FIG. 5A, a surface of the processing article 1 is coated with a photoresist material 4.

Figure 5B:
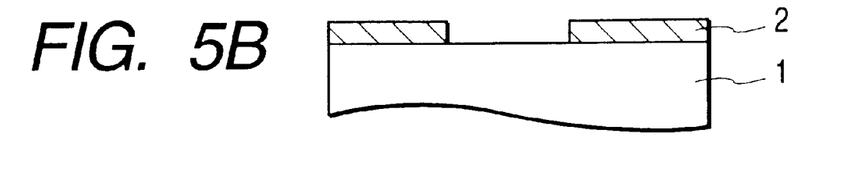

As shown in FIG. 5B, the photoresist material is exposed to be developed, thus providing a photoresist pattern 2.

Figure 5C:
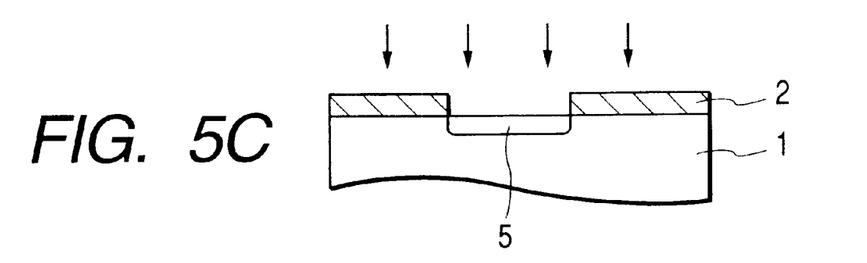

As shown in FIG. 5C, a dopant such as phosphorus, arsenic, boron, or the like is implanted using the photoresist pattern 2 as a mask. In a portion not covered with the photoresist pattern, a doped layer 5 is formed. In addition, the dopant is incorporated into the photoresist pattern.

Figure 5D:
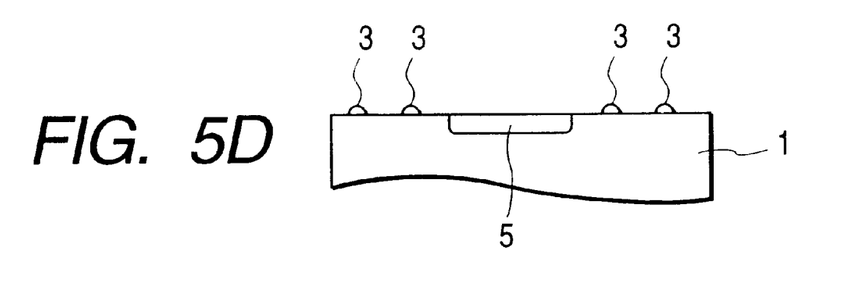
Figure 5E:
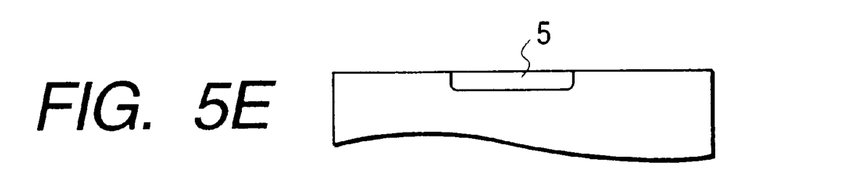

The processing in the first step as described in Embodiments 1 to 3 is carried out to ash and remove the photoresist pattern 2. This leaves a residue 3 consisting of oxides of the dopant on the surface of the processing article 1 as shown in FIG. 5D Subsequently, performing the above described second step results in removal of the residue 3 as shown in FIG. 5E.

Thus, the doped layer 5 of the semiconductor device can be formed.

EXAMPLE

According to the procedure described in Embodiment 3, the photoresist having P ions implanted therein was ashed and the residue was then removed, with the result that the residue consisting of dopant oxides was scarcely left.

According to the Embodiments as described, without leaving any residue of modified organic components, highly efficient ashing for removal can be performed, and corrosion of a surface of the processing article as the underlying material of the organic substance to ash can be suppressed and the cause of particle contamination can be also suppressed. In addition, wet cleaning for removal of a residue required for the conventional processing can be omitted.

What is claimed is:

1. A method of removing a dopant-implanted photoresist to expose a surface of a processing article comprising:

ashing and removing a surface modified layer of the photoresist and an unmodified layer in a lower portion of the photoresist at a first temperature and a first pressure leaving an ashed dopant-containing residue; and removing the ashed dopant-containing residue at a second temperature higher than the first temperature and a second pressure higher than the first pressure.

2. The method according to claim 1, wherein the ashing and removing step comprises ashing using a plasma of a gas not containing fluorine.

3. The method according to claim 1, wherein the removal of the dopant-containing residue comprises a processing using a gas containing at least one of fluorine and hydrogen.

4. The method according to claim 1, wherein the removal of the dopant-containing residue comprises a processing using a gas containing oxygen and at least one of fluorine and hydrogen.

5. The method according to claim 1, wherein the ashing and removing step comprises ashing using a plasma of a first gas not containing fluorine, and wherein the removal of the dopant-containing residue comprises a processing using a second gas containing at least one of fluorine and hydrogen.

6. The method according to claim 1, wherein the ashing and removing step comprises ashing using a plasma of a first gas not containing fluorine, and wherein the removal of the dopant-containing residue comprises a processing using a second gas containing oxygen and at least one of fluorine and hydrogen.

7. The method according to claim 1, wherein the ashing and removing step comprises ashing using a plasma of oxygen, and wherein the removal of the dopant-containing residue comprises a processing using a gas containing oxygen and at least one of carbon fluoride, nitrogen fluoride, sulfur fluoride, and ammonia.

8. The method according to claim 1, wherein the dopant is at least one of phosphorus, arsenic and boron.

9. The method according to claim 1, wherein the ashing comprises a plasma processing using a microwave plasma.

10. The method according to claim 1, wherein the removal of the residue comprises a plasma processing using a microwave plasma.

11. The method according to claim 9 or 10, wherein the microwave plasma is generated by radiating microwaves via a microwave antenna having a plurality of slots provided in a conductor plate.

12. The method according to claim 1, wherein the ashing is carried out in such a state that the processing article is not in contact with a heater, and wherein the removal of the residue is carried out in such a state that the processing article is in contact with a heater.

13. A method of processing an article comprising the steps of:

ashing and removing a surface modified layer of photoresist and an unmodified layer in a lower portion of the photoresist on a surface of an article at a first temperature leaving an ashed dopant-containing residue; and removing the ashed dopant-containing residue of the photoresist at a second temperature higher than the first temperature.

14. The method according to claim 13, wherein the step of ashing and removal comprises ashing using a plasma of a gas not containing fluorine.

15. The method according to claim 13, wherein the step of removal of the residue comprises a processing using a gas containing at least one of fluorine and hydrogen.

16. The method according to claim 13, wherein the step of removal of the residue comprises a processing using a gas containing oxygen and at least one of fluorine and hydrogen.

17. The method according to claim 13, wherein the step of ashing and removal comprises ashing using a plasma of a first gas not containing fluorine, and wherein the step of removal of the residue comprises a processing using a second gas containing at least one of fluorine and hydrogen.

18. The method according to claim 13, wherein the step of ashing and removal comprises ashing using a plasma of a first gas not containing fluorine, and wherein the step of removal of the residue comprises a processing using a second gas containing oxygen and at least one of fluorine and hydrogen.

19. The method according to claim 13, wherein the step of ashing and removal comprises ashing using a plasma of oxygen, and wherein the step of removal of the residue comprises a processing using a gas containing oxygen and at least one of carbon fluoride, nitrogen fluoride, sulfur fluoride, and ammonia.

20. The method according to claim 13, wherein the dopant is at least one of phosphorus, arsenic and boron.

21. The method according to claim 13, wherein the ashing comprises a plasma processing using a microwave plasma.

22. The method according to claim 13, wherein the removal of the residue comprises a plasma processing using a microwave plasma.

23. The method according to claim 21 or 22, wherein the microwave plasma is generated by radiating microwaves via a microwave antenna having a plurality of slots provided in a conductor plate.

24. The method according to claim 13, wherein the step of ashing is carried out in such a state that the processing article is not in contact with a heater, and wherein the step of removal of the residue is carried out in such a state that the processing article is in contact with a heater.

25. A method of producing a semiconductor device comprising the steps of:

forming a photoresist pattern on a surface of a substrate;

implanting a dopant in the substrate using the photoresist pattern as a mask;

ashing and removing a surface modified layer of the photoresist and an unmodified layer in a lower portion of the photoresist on the surface of the substrate at a first temperature leaving an ashed dopant-containing residue; and removing the ashed dopant-containing residue of the photoresist at a second temperature higher than the first temperature.

26. The method according to claim 25, wherein the step of ashing and removal comprises ashing using a plasma of a gas not containing fluorine.

27. The method according to claim 25, wherein the step of removal of the residue comprises a processing using a gas containing at least one of fluorine and hydrogen.

28. The method according to claim 25, wherein the step of removal of the residue comprises a processing using a gas containing oxygen and at least one of fluorine and hydrogen.

29. The method according to claim 25, wherein the step of ashing and removal comprises ashing using a plasma of a first gas not containing fluorine, and wherein the step of removal of the residue comprises a processing using a second gas containing at least one of fluorine and hydrogen.

30. The method according to claim 25, wherein the step of ashing and removal comprises ashing using a plasma of a first gas not containing fluorine, and wherein the step of removal of the residue comprises a processing using a second gas containing oxygen and at least one of fluorine and hydrogen.

31. The method according to claim 25, wherein the step of ashing and removal comprises ashing using a plasma of oxygen, and wherein the step of removal of the residue comprises a processing using a gas containing oxygen and at least one of carbon fluoride, nitrogen fluoride, sulfur fluoride, and ammonia.

32. The method according to claim 25, wherein the dopant is at least one of phosphorus, arsenic and boron.

33. The method according to claim 25, wherein the ashing comprises a plasma processing using a microwave plasma.

34. The method according to claim 25, wherein the removal of the residue comprises a plasma processing using a microwave plasma.

35. The method according to claim 33 or 34, wherein the microwave plasma is generated by radiating microwaves via a microwave antenna having a plurality of slots provided in a conductor plate.

36. The method according to claim 25, wherein the step of ashing is carried out in such a state that the processing article is not in contact with a heater, and wherein the step of removal of the residue is carried out in such a state that the processing article is in contact with a heater.

37. A method of removing a dopant-implanted photoresist to expose a surface of a processing article comprising:

ashing and removing a surface modified layer of the photoresist and an unmodified layer in a lower portion of the photoresist at a first temperature leaving an ashed dopant-containing residue; and removing the ashed dopant-containing residue at a second temperature higher than the first temperature.

38. The method according to claim 37, wherein the ashing and removing step comprises ashing using a plasma of a gas not containing fluorine.

39. The method according to claim 37, wherein the removal of the dopant-containing residue comprises a processing using a gas containing at least one of fluorine and hydrogen.

40. The method according to claims 37, wherein the removal of the dopant-containing residue comprises a processing using a gas containing oxygen and at least one of fluorine and hydrogen.

41. The method according to claim 37, wherein the ashing and removing step comprises ashing using a plasma of a first gas not containing fluorine, and wherein the removal of the ashed dopant-containing residue comprises a processing using a second gas containing at least one of fluorine and hydrogen.

42. The method according to claim 37, wherein the ashing and removing step comprises ashing using a plasma of a first gas not containing fluorine, and wherein the removal of the dopant-containing residue comprises a processing using a second gas containing oxygen and at least one of fluorine and hydrogen.

43. The method according to claim 37, wherein the ashing and removing step comprises ashing using a plasma of oxygen, and wherein the removal of the ashed dopant-containing residue comprises a processing using a gas containing oxygen and at least one of carbon fluoride, nitrogen fluoride, sulfur fluoride, and ammonia.

44. The method according to claim 37, wherein the dopant is at least one of phosphorus, arsenic and boron.

45. The method according to claim 37, wherein the ashing comprises a plasma processing using a microwave plasma.

46. The method according to claim 37, wherein the removal of the residue comprises a plasma processing using a microwave plasma.

47. The method according to claim 45 or 46, wherein the microwave plasma is generated by radiating microwaves via a microwave antenna having a plurality of slots provided in a conductor plate.

48. The method according to claim 37, wherein the ashing is carried out in such a state that the processing article is not in contact with a heater, and wherein the removal of the residue is carried out in such a state that the processing article is in contact with a heater.

* * * * *

UNITED STATES PATENT AND TRADEMARK OFFICE
CERTIFICATE OF CORRECTION

PATENT NO. : 6,417,080 B1
DATED : July 9, 2002
INVENTOR(S) : Shigenobu Yokoshima It is certified that error appears in the above-identified patent and that said Letters Patent is hereby corrected as shown below:

Column 1,
Line 58, "remove" should read -- removed --.

Column 8,
Line 65, "of" should read -- of the --.

Column 10,
Line 47, "claims" should read -- claim --.

Signed and Sealed this

Eleventh Day of February, 2003

JAMES E. ROGAN
*Director of the United States Patent and Trademark Office*